(12) United States Patent
Kim et al.

(10) Patent No.: US 7,116,145 B2
(45) Date of Patent: Oct. 3, 2006

(54) PHASE-LOCKED LOOP CIRCUIT HAVING PHASE LOCK DETECTION FUNCTION AND METHOD FOR DETECTING PHASE LOCK THEREOF

(75) Inventors: Woo-Seok Kim, Suwon-si (KR); Phil-Jae Jeon, Osan-si (KR)

(73) Assignee: Samsung Electronics Co., Ltd., (KR)

( * ) Notice: Subject to any disclaimer, the term of this patent is extended or adjusted under 35 U.S.C. 154(b) by 15 days.

(21) Appl. No.: 10/960,367

(22) Filed: Oct. 6, 2004

(65) Prior Publication Data
US 2005/0073343 A1    Apr. 7, 2005

(30) Foreign Application Priority Data
Oct. 7, 2003    (KR) .................. 10-2003-0069433

(51) Int. Cl.
H03L 7/06    (2006.01)
(52) U.S. Cl. ..................... 327/156; 327/147
(58) Field of Classification Search ........... 327/147, 327/150, 151, 155, 160, 162, 156; 331/1 A, 331/DIG. 2, 25; 375/373, 376, 375
See application file for complete search history.

(56) References Cited
U.S. PATENT DOCUMENTS
5,978,427 A    11/1999   Kuhara ................. 375/376
6,005,425 A    12/1999   Cho ..................... 327/156
6,714,083 B1    3/2004   Ishibashi ............... 331/1 A
6,744,838 B1 *  6/2004   Dixit .................... 375/373
6,757,349 B1 *  6/2004   Katayama et al. ......... 375/376
2002/0171296 A1 11/2002  Ishibashi ............... 307/100

FOREIGN PATENT DOCUMENTS
JP    10-70457      3/1998
JP    02-344312    11/2002

* cited by examiner

Primary Examiner—Linh My Nguyen
(74) Attorney, Agent, or Firm—Mills & Onello LLP

(57) ABSTRACT

A phase-locked loop circuit including a lock detection function is disclosed. The phase-locked loop circuit comprises a lock detection circuit. The lock detection circuit includes a lock-detection-start-signal generator, a lock-detection-clock generator, and a lock-detection-signal generator. The lock-detection-start-signal generates a lock detection start signal when the pulse width of an up signal and a down signal reaches a predetermined value. The lock-detection-clock generator generates a lock detection clock signal on the basis of the up signal and the down signal. The lock-detection-signal generator counts the lock detection clock signal, and generates the lock detection signal. The phase-locked loop circuit is capable of discriminating the operating regions thereof and outputting a lock detection signal when the locking of phase is completed.

45 Claims, 16 Drawing Sheets

PHASE-LOCKED LOOP CIRCUIT HAVING PHASE LOCK DETECTION FUNCTION AND METHOD FOR DETECTING PHASE LOCK THEREOF

CROSS-REFERENCE TO RELATED APPLICATIONS

This application relies for priority upon Korean Patent Application No. 2003-69433 filed on Oct. 7, 2003, the contents of which are herein incorporated by reference in its entirety.

BACKGROUND OF THE INVENTION

1. Field of the Invention

The present invention relates to a phase-locked loop circuit, and particularly to a phase-locked loop circuit capable of outputting a lock detection signal when the locking of phase is entirely accomplished using the operating properties of the phase-locked loop circuit.

2. Description of the Related Art

Phase-locked loop (PLL) circuits have been one of the basic building blocks in modern electronic systems. They have been widely used in communications, multimedia, and other applications. Frequency synthesizers, FM demodulators, clock recovery circuits, modems, and tone decoders are some applications for PLL circuits.

The PLL circuit is a negative feedback control system. As shown in FIG. 1, the PLL circuit generally comprises a phase-frequency detector (PFD) 100, a charge pump 200, a loop filter 300, a voltage-controlled oscillator (VCO) 400, and a frequency divider 500. The PFD 100 generates an up signal SUP and/or a down signal SDN based on the phase (and frequency) difference between a reference signal SIN and a feedback signal SFEED. The charge pump 200 generates output signals whose levels are different from each other according to the state of the up signal SUP and/or the down signal SDN. The output signal of the charge pump 200 is provided to an input of the VCO 400 after the high frequency component thereof is filtered in the loop filter 300. The VCO 400 generates high frequency signals that have different frequencies according to the DC level of the input voltage VCOI. The frequency divider 500 generates the low frequency feedback signal SFEED based on the high frequency VCO output signal. The feedback signal SFEED is applied as an input to the PFD 100. When the PLL circuit is in the lock mode, the phase of the reference signal SIN and the phase of the feedback signal SFEED are locked. In contrast, when the PLL circuit is not in the lock mode, the phase of the reference signal SIN and the phase of the feedback signal SFEED are not locked.

In such the PLL circuit, the output of VCO can be used in various applications described above when the PLL circuit is locked. Accordingly, there is a need for a lock detecting circuit capable of determining whether the PLL circuit is operating in the lock mode or in the unlock mode. One example of such a lock detecting circuit is disclosed in Japanese Patent Application Laid open No. 2002-344312. But, in such a conventional lock detecting circuit, there are problems that lock detection cannot be accurately performed due to noise and that a lock detection signal can be generated when the PLL circuit is not in an entire lock state.

Accordingly, because the lock detecting function is essential in the PLL circuit, there is a need for the PLL circuit of which the lock detection operation can be stably and accurately performed.

SUMMARY OF THE INVENTION

It is a feature of the present invention to provide a phase-locked loop (PLL) circuit capable of outputting a lock detection signal when the locking of phase is entirely accomplished.

It is a feature of the present invention to provide a phase-locked loop circuit capable of discriminating the operating regions thereof.

It is a feature of the present invention to provide a method capable of outputting a lock detection signal when the locking of phase is entirely accomplished.

It is a feature of the present invention to provide a method capable of discriminating the operating regions thereof.

According to one exemplary embodiment of the present invention, there is provided a phase-locked loop circuit including a phase-frequency detector, a voltage-controlled oscillator, and a lock detection circuit. The lock detection circuit includes a lock-detection-start-signal generator, a lock-detection-clock generator, and a lock-detection-signal generator. The lock-detection-start-signal generator receives an up signal and a down signal generated by the phase-frequency detector to generate a lock detection start signal when the pulse width of the up signal or the down signal reaches a predetermined value. The lock-detection-clock generator receives the up signal and the down signal to generate a lock detection clock signal on the basis of the up signal and the down signal. The lock-detection-signal generator receives the lock detection start signal from the lock-detection-start-signal generator and the lock detection clock signal from the lock-detection-clock generator. Further, the lock-detection-signal generator counts the lock detection clock signal, and generates the lock detection signal indicative of a lock state in the phase-locked loop circuit.

In one embodiment, the lock-detection-start-signal generator comprises a NOR circuit, a delay circuit, and a flip-flop. The NOR circuit receives the up signal and the down signal, and executes a logical "NOR" operation for the up and down signals to generate the resultant clock signal. The delay circuit receives the clock signal to delay the clock signal. The flip-flop has an input terminal for receiving the delayed clock signal, a clock terminal for receiving the clock signal, and an inverted output terminal for outputting the lock detection start signal.

In one embodiment, the lock detection circuit adjusts the delay time generated by the delay circuit to control the lock detection time and the accuracy of the lock detection circuit. And, the lock detection circuit can generate the lock detection signal when the output frequency of the PLL approximates to the target value by decreasing the delay time generated by the delay circuit. Also, the lock-detection-clock generator can include a first latch circuit and a second latch circuit coupled to the first latch circuit. The first latch circuit receives and latches the up signal and the down signal to output a first output signal and a second output signal. The second latch circuit receives and latches the first output signal and the second output signal to generate the lock detection clock signal. In one embodiment, each of the first and the second latch circuits includes two NAND circuits of which each of input terminals and each of output terminals are cross-coupled to each other. The lock-detection-signal generator can include at least one flip-flop connected in cascade that is controlled by the lock detection clock signal. In one embodiment, each of the flip-flops is cleared by the lock detection start signal. In one embodiment, the lock-detection-signal generator includes three flip-flops connected in series. In one embodiment, a signal of logic "1" is input to an input terminal of the first flip-flop of the flip-flops, and the signal of logic "1" may be a supply voltage. Each of the input terminals of the flip-flops following after the first stage flip-flop receives an output signal of the preceding stage flip-flop. In one embodiment, the lock-detection-start-signal generator may be cleared by a reset signal, and the signal of logic "1" may be an inverted signal of the reset signal.

According to another exemplary embodiment of the present invention, there is provided a phase-locked loop circuit including a phase-frequency detector, a charge pump, a loop filter, a voltage-controlled oscillator, a lock-detection-start-signal generator, a lock-detection-clock generator, and a lock-detection-signal generator. The phase-frequency detector generates an up signal and a down signal that indicate the phase difference between a reference signal and a feedback signal. The charge pump receives the up signal and the down signal from the phase-frequency detector to output a dc voltage signal in response to the state of the up signal and the down signal. The loop filter integrates the output signal of the charge pump to generate an integrated signal. The voltage-controlled oscillator receives the integrated signal from the loop filter and generates an oscillating signal whose frequency changes, or is controlled, in accordance with the dc level of the integrated signal. The lock-detection-start-signal generator receives the up signal and the down signal generated by the phase-frequency detector to generate a lock detection start signal when the pulse width of the up signal and the down signal reaches a predetermined value. The-lock-detection-clock generator receives the up signal and the down signal to generate a lock detection clock signal on the basis of the up signal and the down signal. The lock-detection-signal generator receives the lock detection start signal from the lock-detection-start-signal generator and the lock detection clock signal from the lock-detection-clock-generator and counts the number of the lock detection clock to generate the lock detection signal.

In one embodiment, the phase-locked loop circuit of the invention further comprises a frequency divider configured to generate a low frequency feedback signal on the basis of a high frequency output signal of the voltage-controlled oscillator.

In one embodiment, the lock-detection-start-signal generator comprises: a NOR circuit configured to receive the up signal and the down signal and execute a logical "NOR" operation, to generate a clock signal; a delay circuit configured to receive the clock signal to delay the clock signal for a certain time; and a flip-flop including an input terminal for receiving the delayed clock signal, a clock terminal for receiving the clock signal, and an inverted output terminal for outputting the lock detection start signal.

In one embodiment, the lock detection circuit adjusts a delay time generated by the delay circuit to control a lock detection time and the accuracy of the lock detection circuit.

In one embodiment, the lock detection circuit generates the lock detection signal when an output frequency of the phase-locked loop circuit approximates to the target value by decreasing the delay time generated by the delay circuit.

In one embodiment, the lock-detection-clock generator comprises: a first latch circuit configured to receive the up signal and the down signal and latch the signals, to output a first output signal and a second output signal; and a second latch circuit configured to receive the first output signal and the second output signal and latch the signals, to generate the lock detection clock signal. In one embodiment, each of the first and the second latch circuits includes two NAND circuits of which input terminals and output terminals are cross-coupled to each other.

In one embodiment, the lock-detection-signal generator includes at least one flip-flop connected in cascade that is controlled by the lock detection clock signal. In-one embodiment, each of the flip-flops is cleared by the lock detection start signal. In one embodiment, the lock-detection-signal generator includes three flip-flops connected in series. In one embodiment, an input terminal of the first flip-flop receives a signal of logic "1", and each of the input terminals of the flip-flops succeeding after the first stage flip-flop receives an output signal of the preceding stage flip-flop. In one embodiment, the signal of logic "1" may be a supply voltage. In one embodiment, the lock-detection-start-signal generator may be cleared by a reset signal, and the signal of logic "1" may be an inverted signal of the reset signal.

According to another exemplary embodiment of the present invention, there is provided a phase-locked loop circuit including a phase-frequency detector, a charge pump, a loop filter, a voltage-controlled oscillator, and a lock detection circuit. The phase-frequency detector generates an up signal and a down signal that indicate the phase difference between a reference signal and a feedback signal. The charge pump receives the up signal and the down signal from the phase-frequency detector to output a dc voltage signal in response to a state of the up signal or the down signal. The loop filter integrates the output signal of the charge pump to generate an integrated signal. The voltage-controlled oscillator receives the integrated signal from the loop filter to generate an oscillating signal whose frequency changes, or is controlled, in accordance with a dc level of the integrated signal. The lock detection circuit receives the up signal and the down signal, and generates a lock detection signal indicating the lock state of phase. In the case in which an operating region of the phase-locked loop circuit is divided into first, second and third operating regions, the phase-locked loop circuit of the embodiment generates the lock detection signal in the third operating region. In the first operating region, the input voltage of the voltage-controlled oscillator increases continuously. In the second operating region, while the input voltage of the voltage-controlled oscillator is repeatedly increased and decreased in rotation, the oscillation amplitude of the input voltage is decreased. In the third operating region, the input voltage of the voltage-controlled oscillator is converged to a certain value and maintains the value.

According to still another exemplary embodiment of the present invention, there is provided a lock detection method of a phase-locked loop circuit which generates a lock detection signal indicating the lock state of the phase-locked loop circuit that includes a phase-frequency detector and a voltage controlled oscillator.

A lock detection method of a phase-locked loop circuit in accordance with the invention comprises receiving an up signal and a down signal generated on the basis of the phase difference between a reference signal and a feedback signal; generating a lock detection start signal when the pulse width of the up or down signal reaches a predetermined value; generating a lock detection clock signal on the basis of the up signal and down signal; and generating the lock detection signal by counting the lock detection clock signal when a lock detection start signal and the lock detection clock signal are received.

In one embodiment, the generating the lock detection start signal is generated by executing a logical NOR operation for the up signal and down signal to generate a clock signal, delaying the clock signal for a certain time, and generating the lock detection start signal in response to the delayed clock signal and the clock signal.

In one embodiment, generating the lock detection clock signal comprises latching the up signal and down signal to output a first output signal and a second output signal, and latching the first output signal and the second output signal to output the lock detection clock signal.

In one embodiment, generating the lock detection signal comprises clearing a lock-detection-signal generator using the lock detection start signal, counting the number of rising edges of the lock detection clock signal; and outputting the lock detection signal. In one embodiment, clearing the lock-detection-signal generator is done when the lock detection start signal is in an active mode.

In one embodiment, delaying the clock signal includes adjusting a delay time so that a lock detection time and an accuracy of a lock detection circuit may be controlled.

In one embodiment, generating the lock detection signal is possible when an output frequency of the phase-locked loop circuit approximates to a target value by decreasing a delay time generated by delaying the clock signal.

According to further still another embodiment of the present invention, a lock detection method of a phase-locked loop circuit comprises generating an up signal and a down signal indicating the phase difference between a reference signal and a feedback signal; outputting a dc voltage signal in response to the state of the up signal and the down signal; integrating the dc voltage signal to generate an integrated signal; generating an oscillating signal whose frequency changes in accordance with the dc level of the integrated signal; and receiving the up and down signals to generate a lock detection signal indicating the lock state of phase. In one embodiment, the lock detection signal is generated in a third operating region when the operating region of the phase-locked loop circuit is divided into a first operating region, a second operating region and a third operating region. In the first operating region, the input voltage of the voltage-controlled oscillator increases continuously. In the second operating region, while the input voltage of the voltage-controlled oscillator is repeatedly increased and decreased in rotation, the oscillation amplitude of the input voltage is decreased. In the third operating region, the input voltage of the voltage-controlled oscillator is converged to a certain value and maintains it.

According to the present invention, the phase-locked loop circuit is capable of discriminating the operating regions thereof and outputting a lock detection signal when the locking of phase is completed using the characteristics of the operating regions.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DESCRIPTION OF EMBODIMENTS

Detailed illustrative embodiments of the present invention are disclosed herein. However, specific structural and functional details disclosed herein are merely representative for purposes of describing exemplary embodiments of the present invention.

Figure 1:
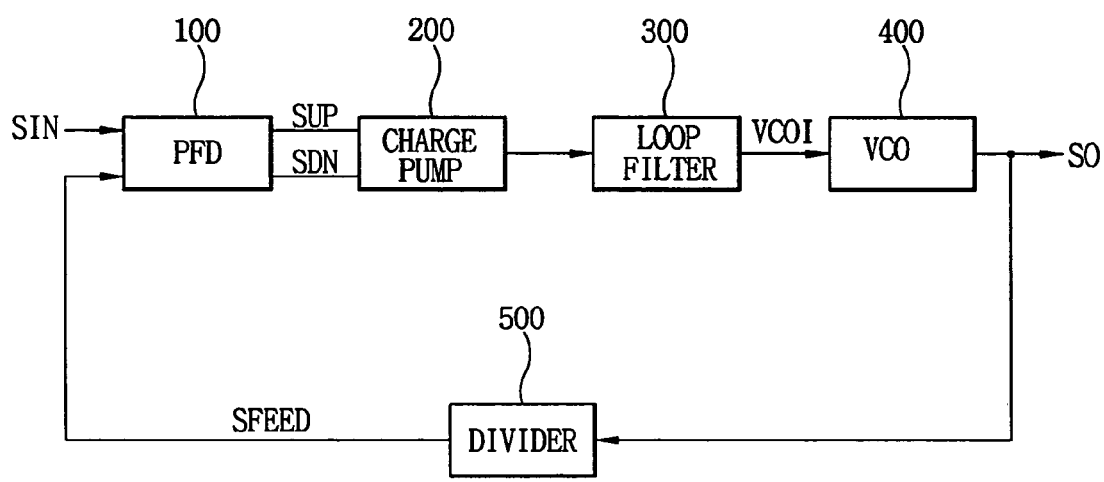
FIG. 1 is a block diagram showing a conventional PLL circuit.
Figure 2:
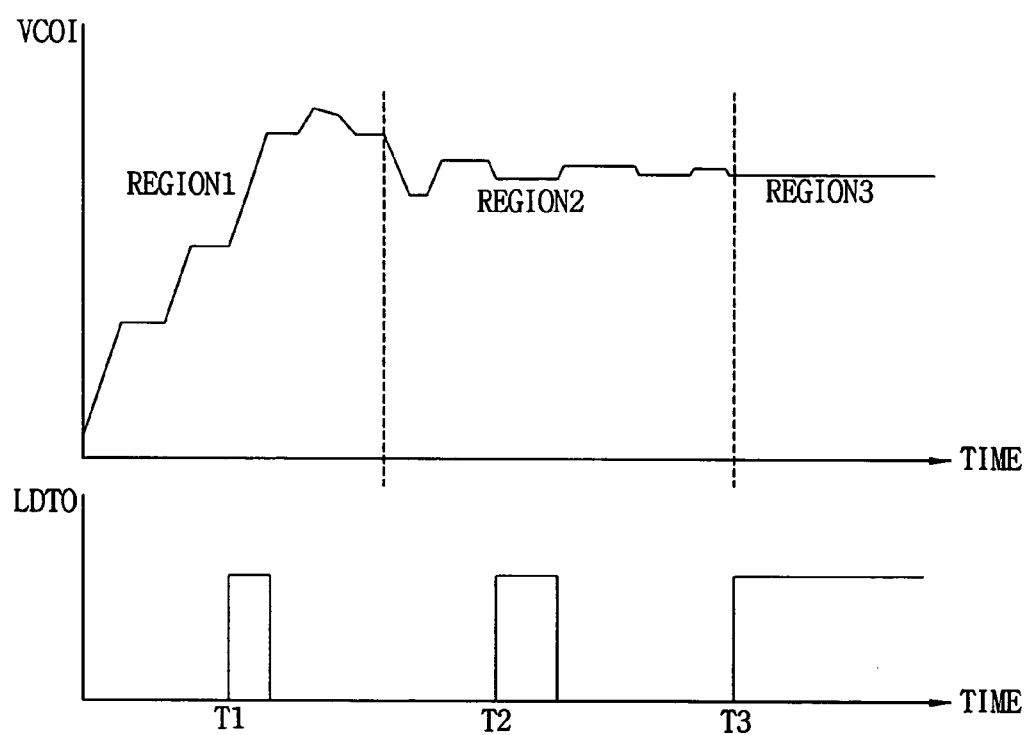
FIG. 2 is a schematic diagram showing an operating region of a PLL circuit and a point of time where a lock detection signal is generated.

FIG. 2 is a schematic diagram showing an operating region of a PLL circuit and a point of time where a lock detection signal is generated. As shown in FIG. 2, the operating region of the PLL circuit can be divided into three of first, second and third operating regions REGION1, REGION2 and REGION3 according to the lapse of time from power-on to the locking of the PLL circuit. In the first operating region REGION1, the input signal VCOI of the VCO, which is a component circuit block of the PLL circuit, is increased continuously. In the second operating region REGION2, while the input signal VCOI of the VCO is repeatedly increased and decreased in rotation, the oscillation amplitude is decreased so that the input signal VCOI is converged to a certain value. In the third operating region REGION3, the input signal VCOI of the VCO maintains the certain value.

It is desirable that the phase lock detection signal be generated at T3, the time point where the operation of PLL circuit enters the third operating region REGION3. However, according to the conventional phase lock detection circuit, there were cases in which the phase lock detection signal was generated in the first operating region REGION1 or in the second operating region REGION2.

According to the present invention, the phase lock detection circuit is designed to generate the phase lock detection signal only when the operation of the PLL circuit enters the third operating region REGION3 by considering the operating properties of the PLL circuit in these three operating regions REGION1, REGION2, and REGION3.

Figure 3:
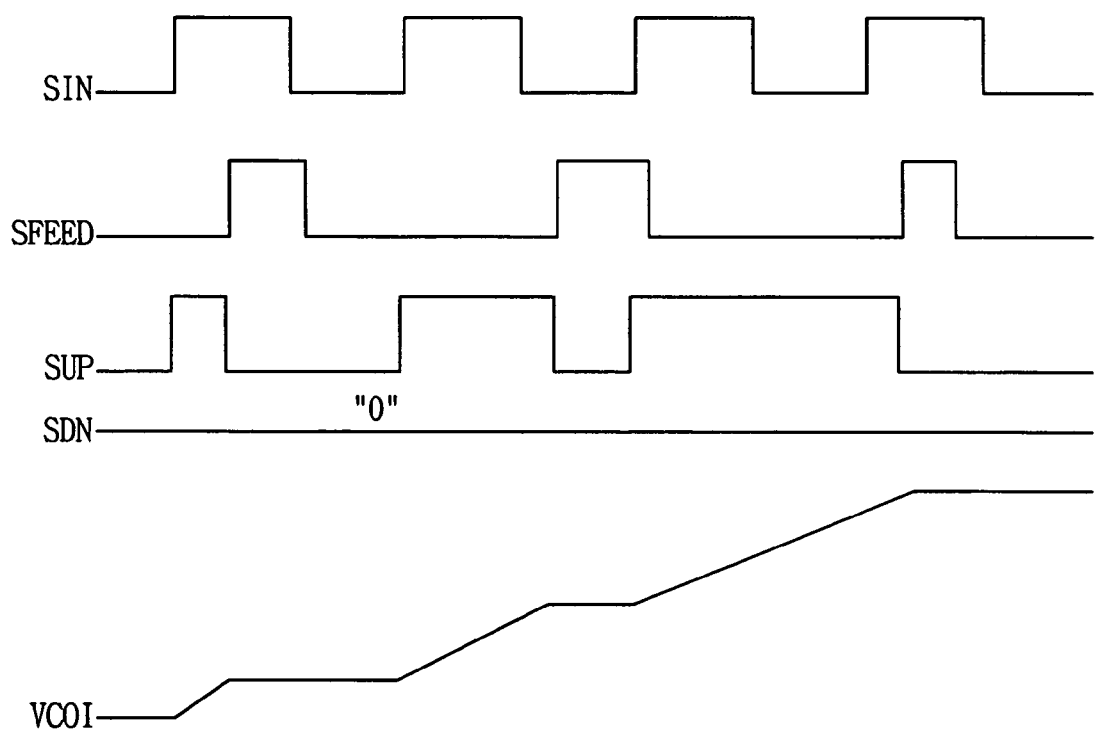
FIG. 3 is a timing diagram illustrating the operation of the PLL circuit in the first operating region.

FIG. 3 is a timing diagram illustrating the operation of the PLL circuit in the first operating region REGION1. Referring to FIG. 3, a frequency of a feedback signal SFEED is lower than that of the reference signal SIN, which is the input signal of the PLL circuit. The pulse width of the up signal SUP increases continuously, but the down signal SDN remains in a logic "0" state. The input signal VCOI of the VCO increases continuously in response to the up signal SUP.

Figure 4:
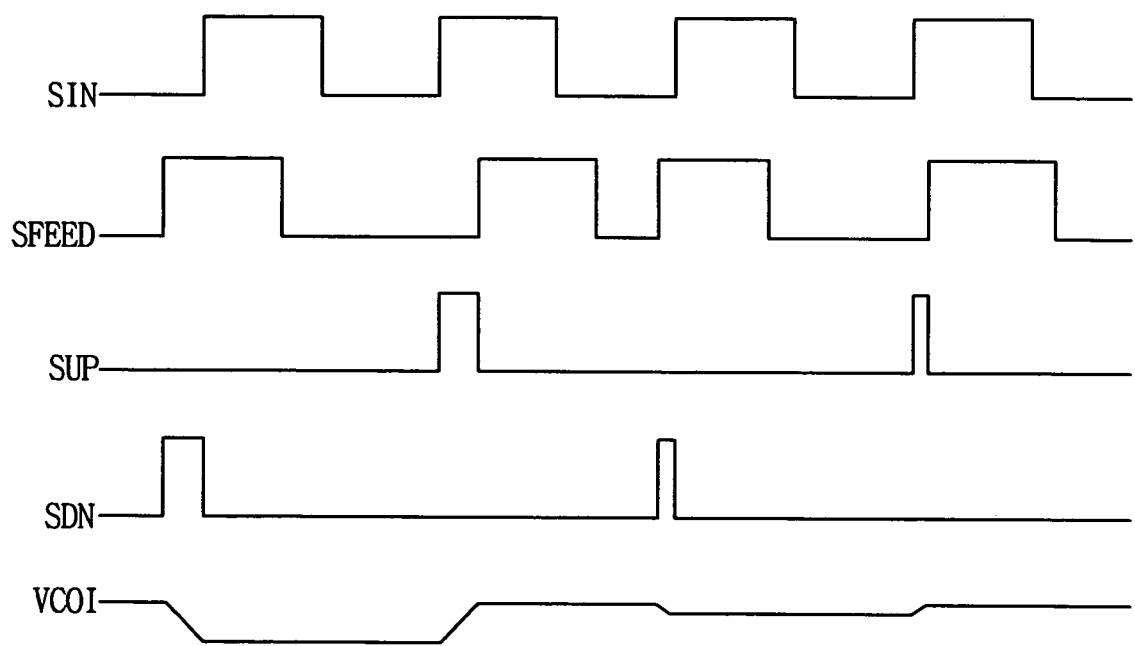
FIG. 4 is a timing diagram illustrating the operation of the PLL circuit in the second operating region.

FIG. 4 is a timing diagram illustrating the operation of the PLL circuit in the second operating region REGION2. Referring to FIG. 4, the frequency of the reference signal SIN, which is an input signal of the PLL circuit, is fixed, but the frequency of the feedback signal SFEED is increased or decreased in rotation. While The pulses of the up signal SUP and the down signal SDN are generated in rotation, the pulse widths of each of the up signal SUP and the down signal SDN are gradually decreased. The input signal VCOI of the VCO is increased when the pulse of the up signal SUP is generated, and it is decreased when the pulse of the down signal SDN is generated. Further, the oscillation amplitude of the input signal VCOI of the VCO is gradually decreased to converge to a certain value.

Figure 5:
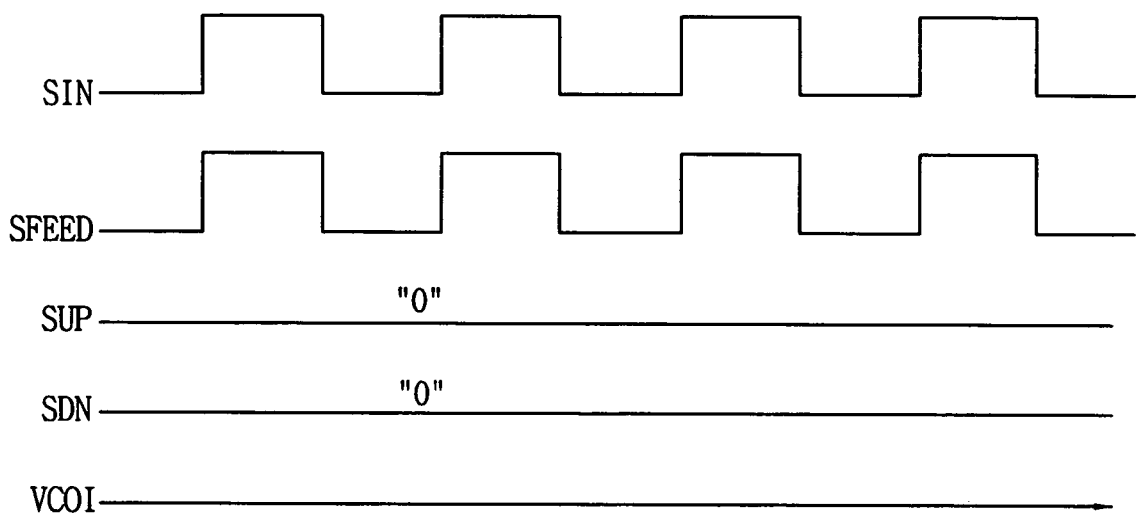
FIG. 5 is a timing diagram illustrating the operation of the PLL circuit in the third operating region.

FIG. 5 is a timing diagram illustrating the operation of the PLL circuit in the third operating region REGION3. Referring to FIG. 5, the reference signal SIN, which is the input signal of the PLL circuit, and the feedback signal SFEED are locked in phase with each other and have a certain value of period. The up signal SUP and the down signal SDN maintains the logic "0" state, and the input signal VCOI of the VCO 400 has a certain value.

Figure 6:
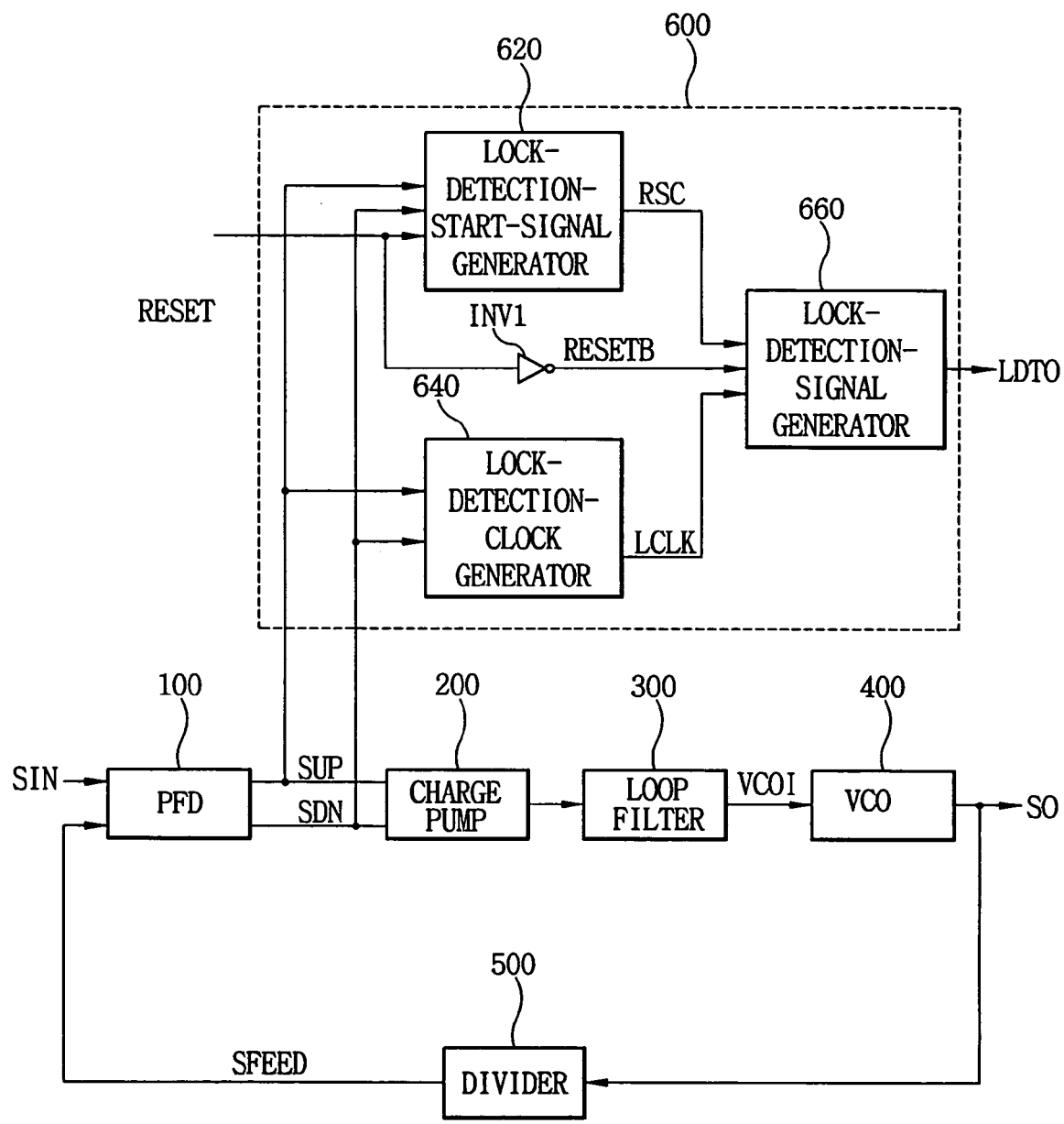
FIG. 6 is a simplified block diagram showing a PLL circuit having lock detection function according to an embodiment of the present invention.

FIG. 6 is a simplified block diagram showing a PLL circuit having a lock detection function according to an embodiment of the present invention. The PLL circuit of FIG. 6 generates a phase lock detection signal only when the PLL circuit enters the third operating region REGION3 by considering the operating properties of the PLL circuit in the operating regions REGION1, REGION2, and REGION3.

Referring to FIG. 6, the PLL circuit includes a phase-frequency detector (PFD) 100, a charge pump 200, a loop filter 300, a voltage-controlled oscillator (VCO) 400, a frequency divider 500, and a lock detection circuit 600. The lock detection circuit 600 includes an inverter INV1, a lock-detection-start-signal generator 620, a lock-detection-clock generator 640, and a lock-detection-signal generator 660.

The PFD 100 generates an up signal SUP and a down signal SDN based on the phase difference (and frequency difference) between the reference signal SIN and the feedback signal SFEED. The charge pump 200 generates a dc voltage signal in response to the level state of the up signal and the down signal to provide the signal to the loop filter 300. The loop filter 300 integrates the dc voltage signal received from the charge pump 200 to generate an integrated signal in which a high frequency component is removed. The VCO 400 outputs high frequency signals having different frequencies according to the dc level of the input signal VCOI of the VCO 400. The frequency divider 500 generates a low frequency feedback signal SFEED on the basis of the high frequency signal output from the VCO 400. The feedback signal SFEED is applied to the PFD 100. When the PLL circuit is in the lock mode, the phase of the reference signal SIN and the phase of the feedback signal SFEED are locked. On the contrary, when the PLL is not in the lock mode, the phase of the reference signal SIN and the phase of the feedback signal SFEED are not locked. The inverter INV1 receives a reset signal RESET and inverts it to generate an inverted reset signal RESETB. The lock-detection-start-signal generator 620 receives the up signal SUP, the down signal SDN, and the reset signal RESET to generate a lock detection start signal RSC which represents the start of lock detection. And, the lock-detection-clock generator 640 receives the up signal SUP and the down signal SDN to generate a lock detection clock signal LCLK. The lock-detection-signal generator 660 receives the lock detection start signal RSC and the inverted reset signal RESETB and the lock detection clock signal LCLK to generate a lock detection signal LDTO.

Figure 7:
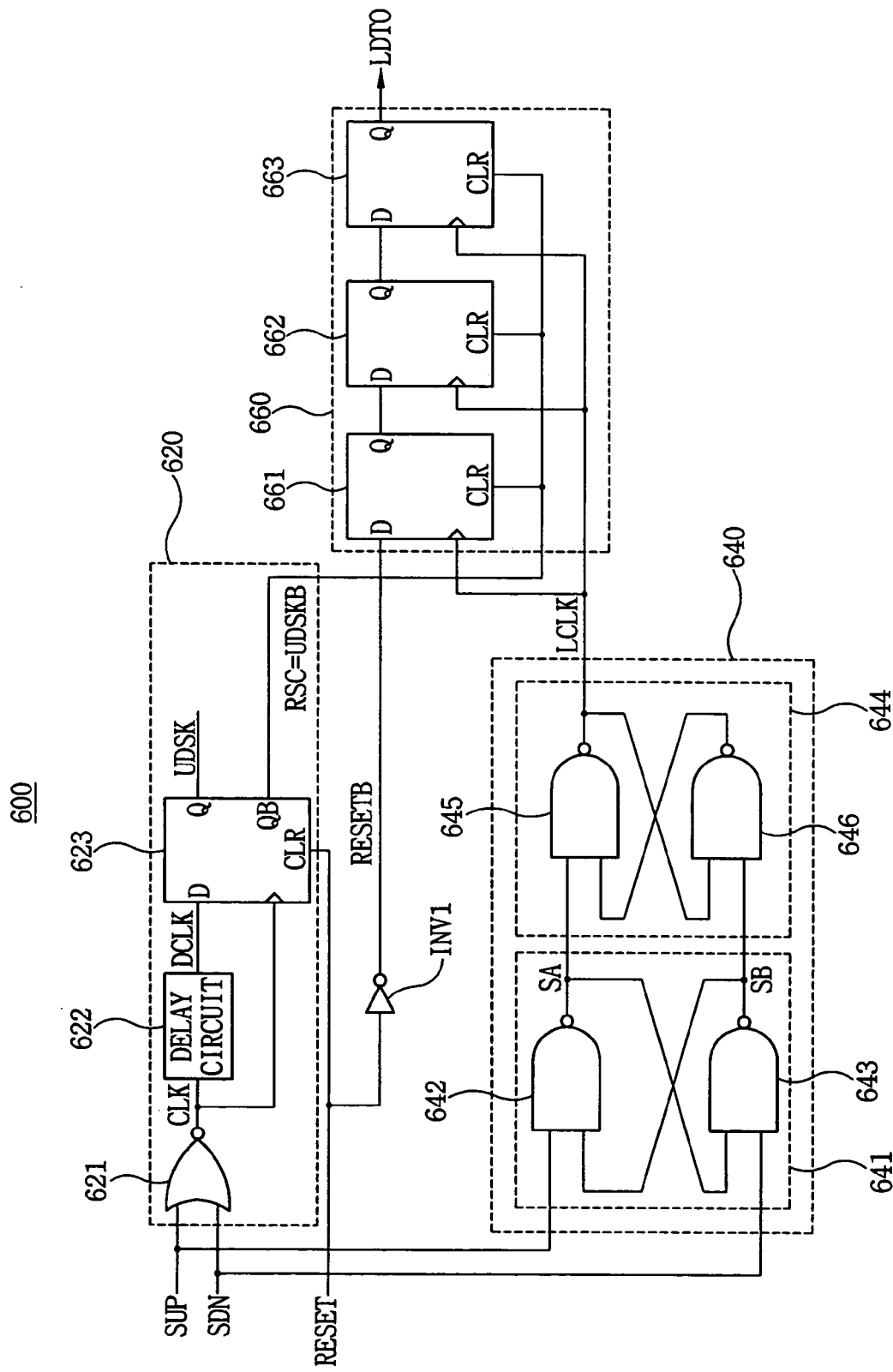
FIG. 7 is a circuit diagram showing a lock detection circuit in the PLL circuit of FIG. 6.

FIG. 7 is a circuit diagram showing a lock detection circuit 600 in the PLL circuit of FIG. 6. The lock detection circuit 600 of FIG. 7 comprises an inverter INV1, a lock-detection-start-signal generator 620, a lock-detection-clock generator 640, and a lock-detection-signal generator 660.

The lock-detection-start-signal generator 620 includes a NOR circuit 621, a delay circuit 622, and a D-type flip-flop 623. The NOR circuit 621 receives the up signal SUP and the down signal SDN, and executes a logical "NOR" operation for the signals SUP and SDN to output the resultant clock signal CLK. The delay circuit 622 is connected to the output terminal of the delay circuit 622 to receive the clock signal CLK from the NOR circuit 621, so that it delays the received clock signal CLK for a certain time to generate a delayed clock signal DCLK. The D-type flip-flop 623 is connected to the output terminal of the delay circuit 622 to receive the delayed clock signal DCLK from the delay circuit 622. Further, the D-type flip-flop 623 is enabled by the clock signal CLK. The up/down skew signal UDSK is outputted from the output terminal Q of the D-type flip-flop 623, and the lock detection start signal RSC is outputted from the inverted output terminal QB of the D-type flip-flop 623. The lock detection start signal RSC is an inverted signal UDSKB of the up/down skew signal UDSK. The lock detection clock generator 640 includes two latch circuits 641 and 644 connected in series to each other. The first latch circuit 641 includes two NAND circuits 642 and 643 which are cross-connected to each other. The first latch circuit 641 receives the up signal SUP and the down signal SDN to output a first output signal SA and a second output signal SB. The second latch circuit 644 includes two NAND circuits 645 and 646 which are cross-connected to each other. The second latch circuit 644 receives the two output signals SA and SB to output a lock detection clock signal LCLK. The lock-detection-signal generator 660 includes D-type flip-flops 661, 662 and 663 which are connected in series to form a shift register. The D-type flip-flops 661, 662 and 663 are enabled by the lock detection clock signal LCLK and cleared by the lock detection start signal RSC. The inverted reset signal RESETB that is inverted by the inverter INV1 is applied to the input terminal D of the D-type flip-flop 661. The output terminal Q of the D-type flip-flop 661 is coupled to the input terminal D of the D-type flip-flop 662. The output terminal Q of the D-type flip-flop 662 is coupled to the input terminal D of the D-type flip-flop 663. The lock detection signal LDTO is outputted from the output terminal Q of the D-type flip-flop 663.

Figure 8:
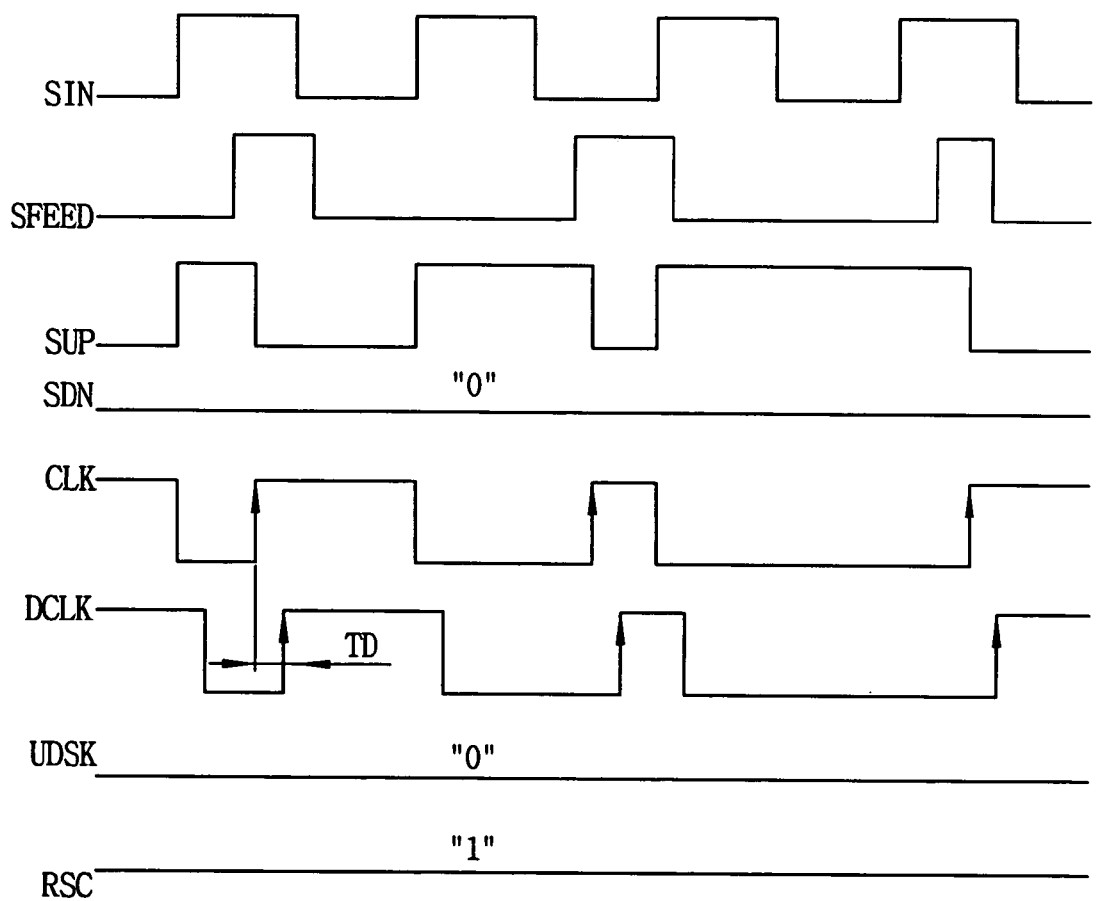
FIG. 8 is a timing diagram illustrating the operation of the PLL circuit of FIG. 6 and the detection circuit of FIG. 7 in the first operating region.

FIG. 8 is a timing diagram illustrating the operation of the PLL circuit of FIG. 6 and the lock detection circuit of FIG. 7 in the first operating region.

Figure 9:
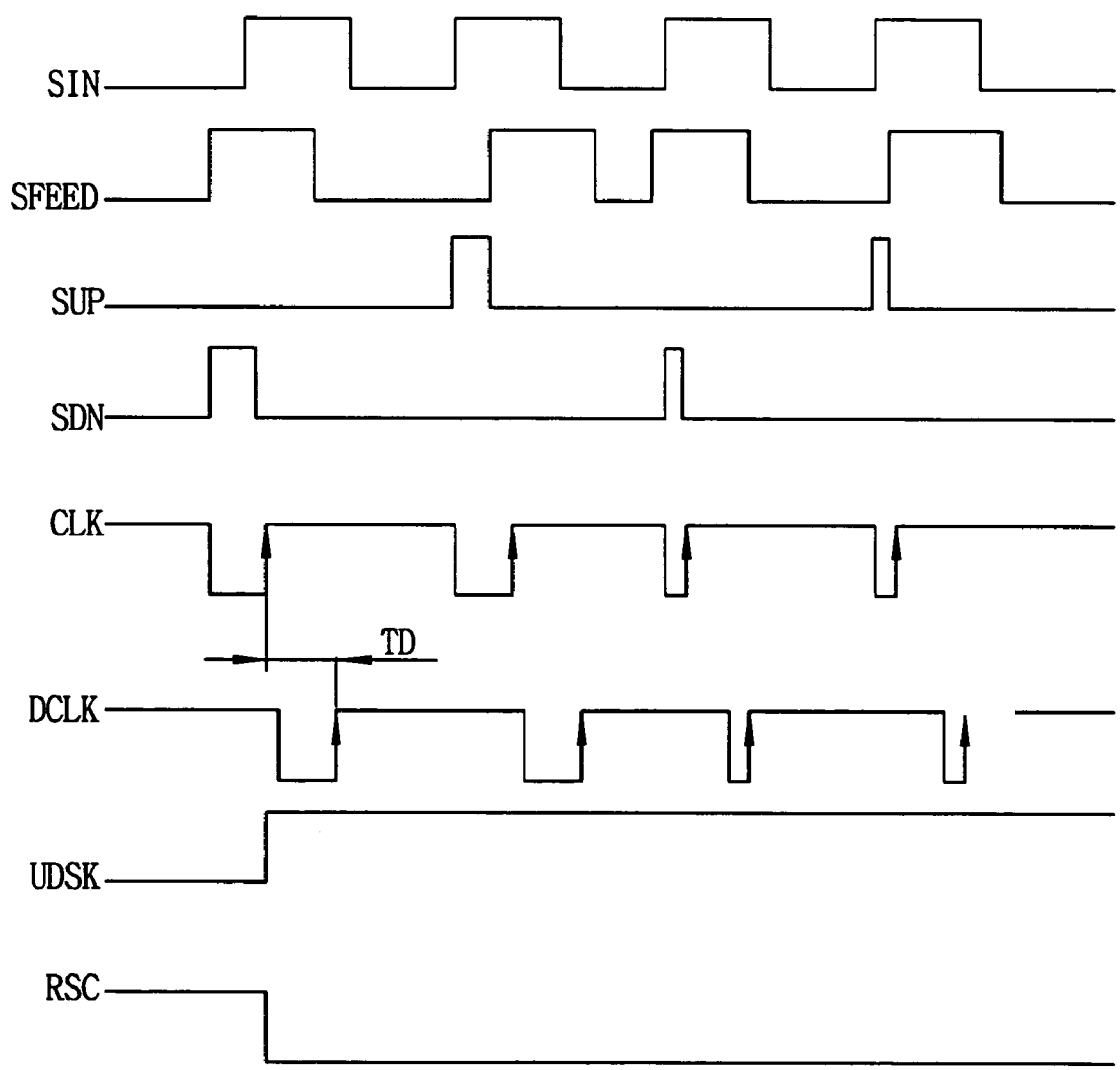
FIG. 9 is a timing diagram illustrating the operation of the PLL circuit of FIG. 6 and the detection circuit of FIG. 7 in the second operating region when the delay time is long.
Figure 10:
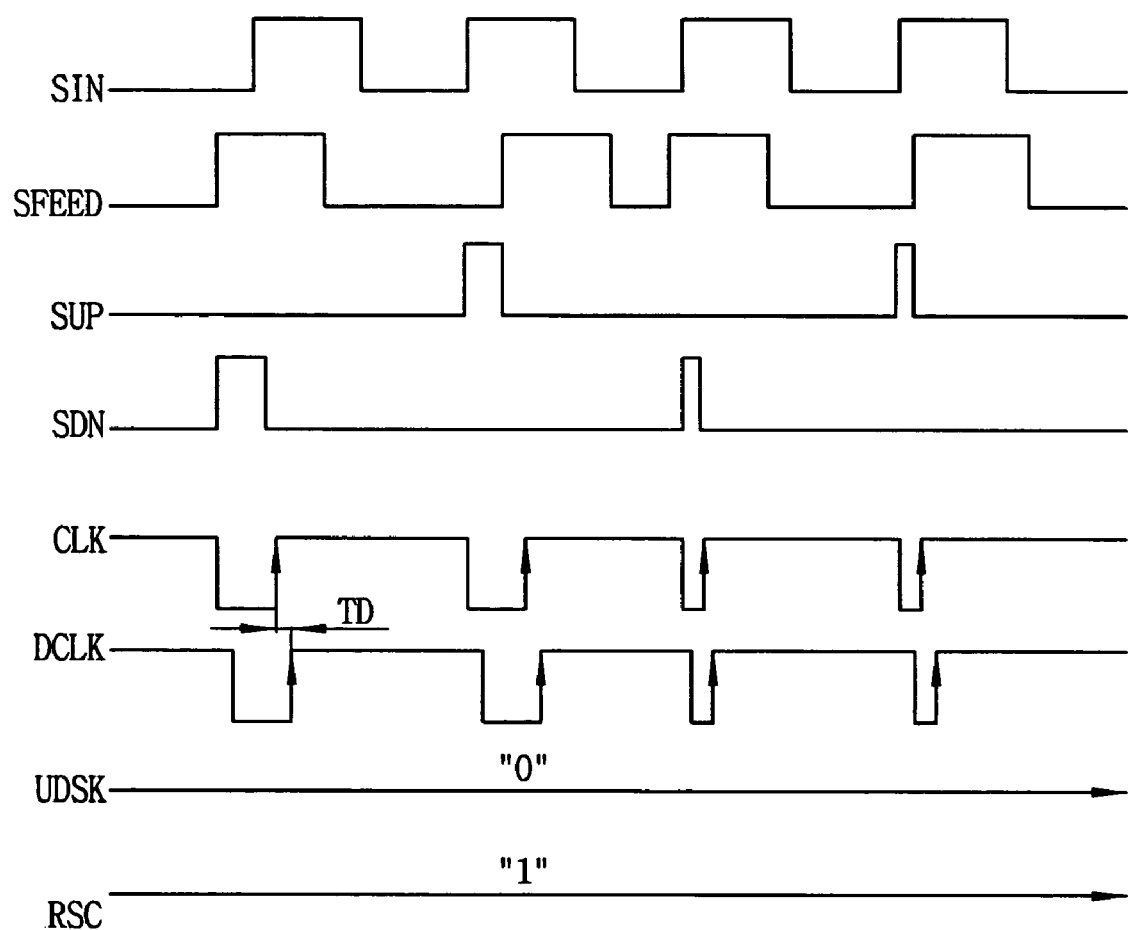
FIG. 10 is a timing diagram illustrating the operation of the PLL circuit of FIG. 6 and the detection circuit of FIG. 7 in the second operating region when the delay time is short.

FIG. 9 is a timing diagram illustrating the operation of the PLL circuit of FIG. 6 and the lock detection circuit of FIG. 7 in the second operating region when the delay time is long, and FIG. 10 is a timing diagram illustrating the operation of the PLL circuit of FIG. 6 and the lock detection circuit of FIG. 7 in the second operating region when the delay time is short.

Figure 11:
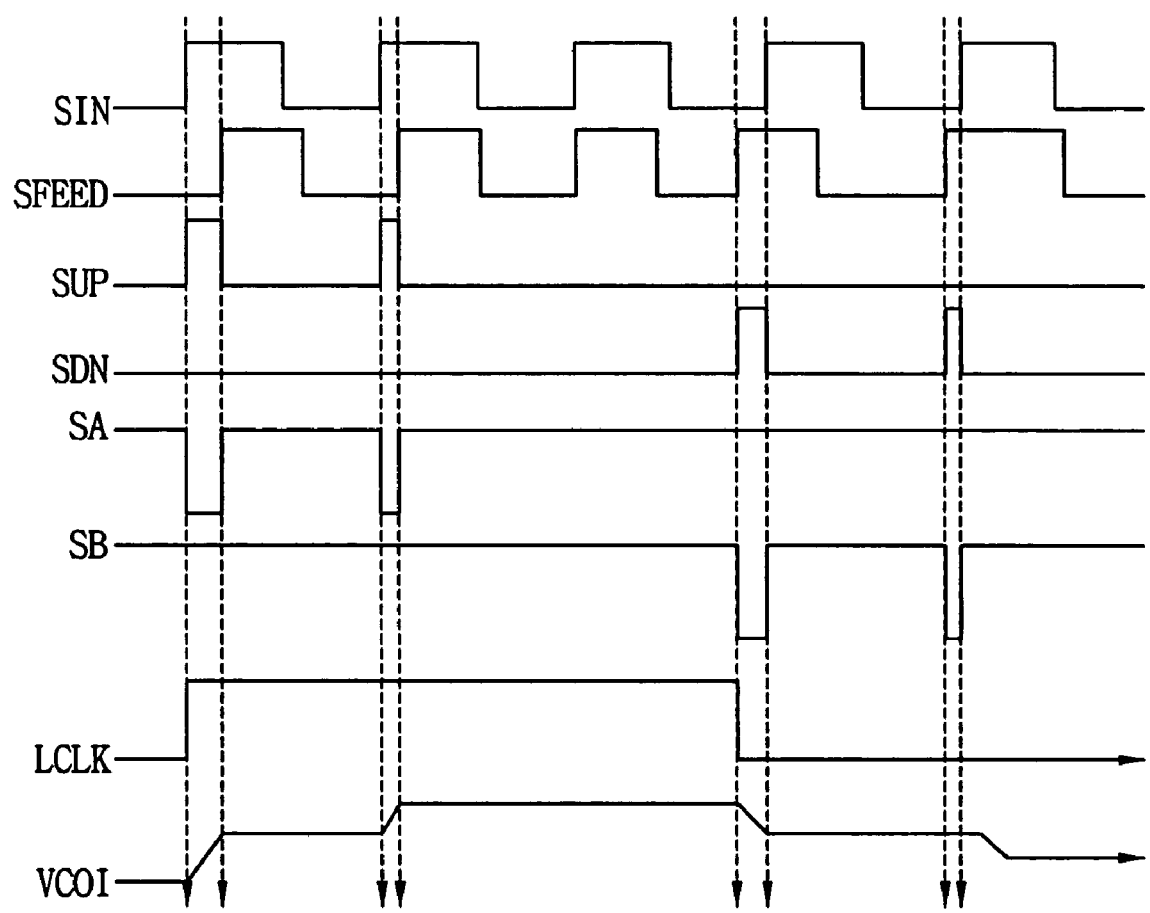
FIG. 11 is a timing diagram illustrating the operation of the circuits of FIG. 6 and FIG. 7 when the operating region of the PLL circuit is changed from the second operating region to the third operating region.

FIG. 11 is a timing diagram illustrating the operation of the circuits of FIG. 6 and FIG. 7 when the operating region of the PLL circuit is changed from the second operating region to the third operating region.

Referring to timing diagrams shown in FIG. 8 to FIG. 11, the operation of the PLL circuit having a lock detection function according to the first embodiment of this invention will be described.

Referring to FIG. 8, in a first operating region (REGION1 shown in FIG. 2), the frequency of the feedback signal SFEED is much lower than the frequency of the reference signal SIN of the PLL circuit. That is to say, a large time skew is present between the reference signal SIN and the feedback signal SFEED, and the up signal SUP and the down signal SDN proportional to the time skew is generated. The period of the logic "1" increases continuously for the up signal SUP, and the down signal SDN is maintained in the state of the logic "0". The NOR circuit 621 receives the up signal SUP and the down signal SDN, executes the logical "NOR" operation for the signals SUP and SDN to output the resultant clock signal CLK. When the PLL circuit operates in the first operating region REGION1, the clock signal CLK has a waveform in which the state of logic "0" is relatively long. The clock signal CLK is provided to the delay circuit 622 tor delay the signal CLK for the predetermined time and thereby generate the delayed clock signal DCLK that has the same period as the clock signal CLK. According to the amount of delay time TD, the boundary of the first operating region REGION1 and the second operating region REGION2 is defined. That is, the start point of lock detection is determined according to the amount of delay time TD. The delayed clock signal DCLK is maintained in the logic "0" state in the rising edge of the clock signal CLK. Thus, the output signal UDSK of the D-type flip-flop 623 is in the logic "0" state, and the inverted output signal UDSKB of the D-type flip-flop 623 is in a logic "1" state. The D-type flip-flop 623 comes to be cleared when the reset signal RESET is enabled. When the PLL circuit operates in the first operating region REGION1, the output signal UDSK of the D-type flip-flop 623 is in the logic "0" state. And the lock detection start signal RSC, the inverted output signal UDSKB of the D-type flip-flop 623, is in the logic "1" state when the reset signal RESET is in a disable state as well as in an enable state. The lock detection start signal RSC is used to clear the D-type flip-flops 661, 662 and 663 of the lock-detection-signal generator 660. When the PLL circuit is in the first operating region REGION1, the lock detection start signal RSC is in the logic "1" state. Therefore, the logic "1" is input to each clear terminal of the D-type flip-flops 661, 662 and 663 of the lock-detection-signal generator 660. Accordingly, the lock detection signal LDTO becomes in the logic "0" state. When the pulse width of the up signal SUP or the down signal SDN is greater than the delay time TD that is set by the delay circuit 622, the lock-detection-start-signal generator 620 outputs the logic "1". At this time, the PLL circuit is operated in the first operating region REGION1. When the pulse width of the up signal SUP or the down signal SDN is less than the delay time TD that is set by the delay circuit 622, the lock-detection-start-signal generator 620 outputs the logic "0".

Referring to FIG. 9, in the second operating region REGION2 of the PLL circuit, the frequency of the reference signal SIN, which is the input signal of the PLL circuit, and the frequency of the feedback signal SFEED increase or decrease. The pulse widths of the up signal SUP and the down signal SDN decrease, and the up signal SUP and the down signal SDN are generated alternately. FIG. 10 is a timing diagram illustrating the operation of the PLL circuit of FIG. 6 and the lock detection circuit of FIG. 7 when the delay time is short compared with the case represented in FIG. 9. As in FIG. 9, in the case where the delay time TD is long, even though the pulse widths of the up signal and the down signal are a little larger, the lock detection start signal RSC may be in the logic "0" state. However, as in FIG. 10, in the case where the delay time TD is short, the lock detection start signal RSC may be in the logic "0" state when the pulse widths of the up signal and the down signal becomes very small. When the lock detection start signal RSC become in the logic "0" state, the lock-detection signal generator 660 is set and the lock detection operation starts.

The operation of the lock detection clock generator 640 is as follows.

In the second operating region REGION2 of the PLL circuit, the up signal SUP and the down signal SDN are generated alternately. That is, the input signal VCOI of the VCO 400 in FIG. 6 is increased or decreased alternately. The lock detection circuit of FIG. 7 detects whether the up signal SUP and the down signal SDN are generated alternately using the two stage RS-latch circuits 641 and 644.

The operation of the general RS-latch circuit constructed with NAND circuits is represented in Table 1.

TABLE 1

| R | S | $Q_n$ | $Q_nB$ |
|---|---|---|---|
| 0 | 1 | 1 | 0 |
| 1 | 0 | 0 | 1 |
| 1 | 1 | $Q_{n-1}$ | $Q_{n-1}B$ |
| 0 | 0 | 1 | 1 |

As represented in Table 1, when the set input S is logic "1" and the reset input R is logic "0", the output $Q_n$ becomes logic "1". When the set input S is logic "0" and the reset input R is logic "1", the output $Q_n$ becomes logic "0". Further, when both of the set input S and the reset input R are logic "1", the output $Q_n$ maintains the prior value $Q_{n-1}$, when both of the set input S and the reset input R are logic "0", the output $Q_n$ and the inverted output $Q_nB$ become logic "1".

The lock-detection-clock generator 640 receives the up signal SUP and the down signal SDN, and generates the lock detection clock signal LCLK.

The relation among the up signal SUP, the down signal SDN, the two outputs SA and SB and the lock detection clock signal LCLK is represented in Table 2.

TABLE 2

| SUP | SDN | $SA_n$ | $SB_n$ | $LCLK_n$ |
|---|---|---|---|---|
| 0 | 1 | 1 | 0 | 0 |
| 1 | 0 | 0 | 1 | 1 |
| 1 | 1 | $SA_{n-1}$ | $SB_{n-1}$ | $LCLK_{n-1}$ |
| 0 | 0 | 1 | 1 | $LCLK_{n-1}$ |

As represented in Table 2, the state of the lock detection clock signal LCLK is changed only when the up signal SUP and the down signal SDN changes from the logic "1"/"0" state to the logic "0"/"1" state, or from the logic "0"/"1" state to the logic "1"/"0" state. When both of the up signal SUP and the down signal SDN are logic "0" or "1", the lock detection clock signal LCLK maintains the prior state $LCLK_{n-1}$. As expressed in Table 2, the two outputs SA and SB of the first latch circuit 641 become logic "1" when both of the up signal SUP and the down signal SDN are in the logic "0" state. In the present invention, the lock detection clock signal LCLK maintains the prior state $LCLK_{n-1}$ because the two stage RS-latch circuits 641 and 644 are used.

The operation of the lock detection signal generator 660 is as follows.

Once the lock detection circuit 600 is in a set mode, the inverted reset signal RESETB becomes in the "1" logic state. The lock detection signal generator 660 becomes cleared according to the state of the lock detection start signal RSC when the reset signal RESET is not only logic "1" but also logic "0". Accordingly, the lock detection signal LDTO is maintained in the logic "0" state. Each of the D-type flip-flops 661, 662, 663 outputs the input signal at the rising edge of the lock detection clock signal LCLK. The D-type flip-flop 661 outputs the signal of the logic "1" state at the first rising edge of the lock detection clock signal LCLK. The D-type flip-flop 662 outputs the signal of the logic "1" state at the second rising edge of the lock detection clock signal LCLK. The D-type flip-flop 663 outputs the lock detection clock signal of the logic "1" state at the third rising edge of the lock detection clock signal LCLK.

Referring to FIG. 11, the rising edge of the lock detection clock signal LCLK is generated at the rising edge of the up signal SUP when the down signal SDN is logic "0", and the falling edge of the lock detection clock signal LCLK is generated at the rising edge of the down signal SDN when the up signal is logic "0". Further, the input signal VCOI of the VCO 400 shown in FIG. 6 increases when the pulse of the up signal SUP is generated, and decreases when the pulse of the down signal SDN is generated.

Figure 12:
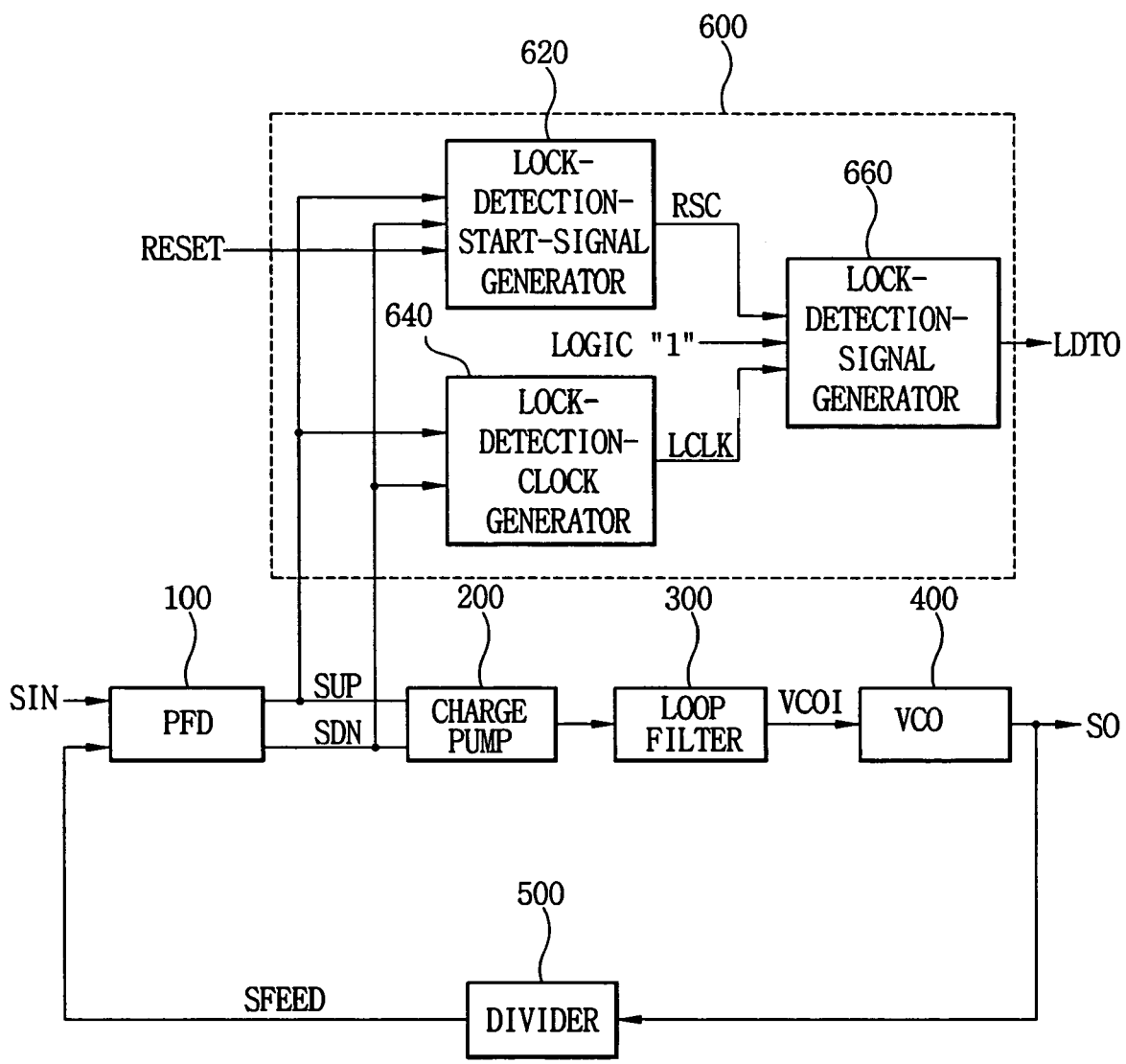
FIG. 12 is a block diagram showing a PLL circuit having a lock detection function according to another embodiment of the present invention.

FIG. 12 is a block diagram showing a PLL circuit having lock detection function according to another embodiment of the present invention. The structure of the PLL circuit shown in FIG. 12 is the same as that of FIG. 6 except that logic "1" instead of the inverted reset signal RESETB is applied to the lock detection signal generator 660.

Figure 13:
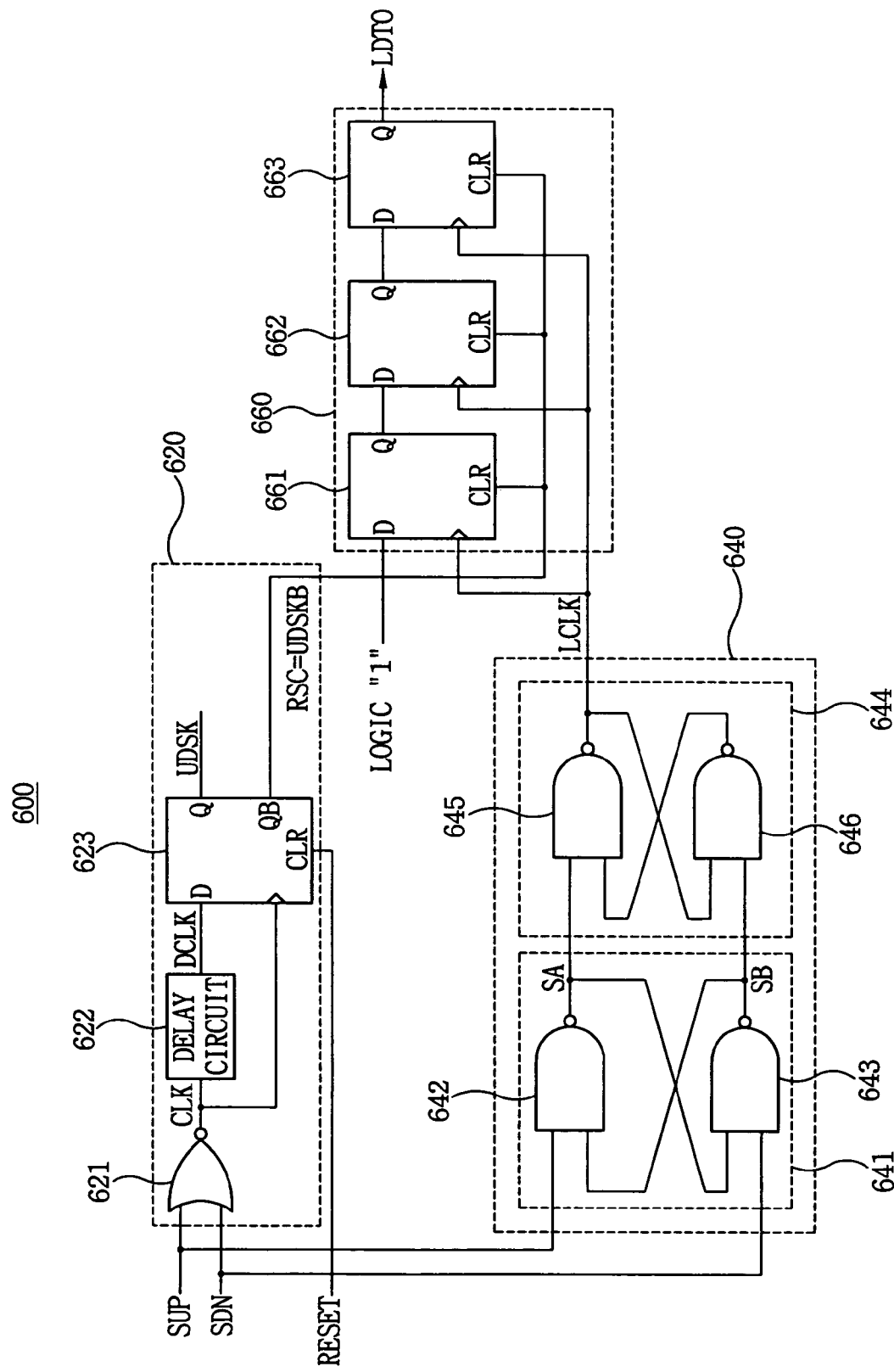
FIG. 13 is a circuit diagram showing a lock detection circuit in the PLL circuit of FIG. 12.

FIG. 13 is a detailed circuit diagram of a lock detection circuit in the PLL circuit shown in FIG. 12. The structure of the PLL circuit shown in FIG. 13 is the same as that of FIG. 7 except that logic "1" instead of the inverted reset signal RESETB is applied to the lock-detection-signal generator 660. When the lock detection circuit operates in the set mode, the inverted reset signal RESETB is in the logic "1" state. Therefore, logic "1" may be used as an input signal of the lock-detection-signal generator 660. In actually designing the circuit, the logic "1" signal may be implemented using power source voltage.

The operation of the PLL circuit of FIG. 12 is similar to that of FIG. 6, and the operation of the PLL circuit of FIG. 13 is similar to that of FIG. 7. Therefore, description of the operation of the circuits will not be repeated here.

Figure 14:
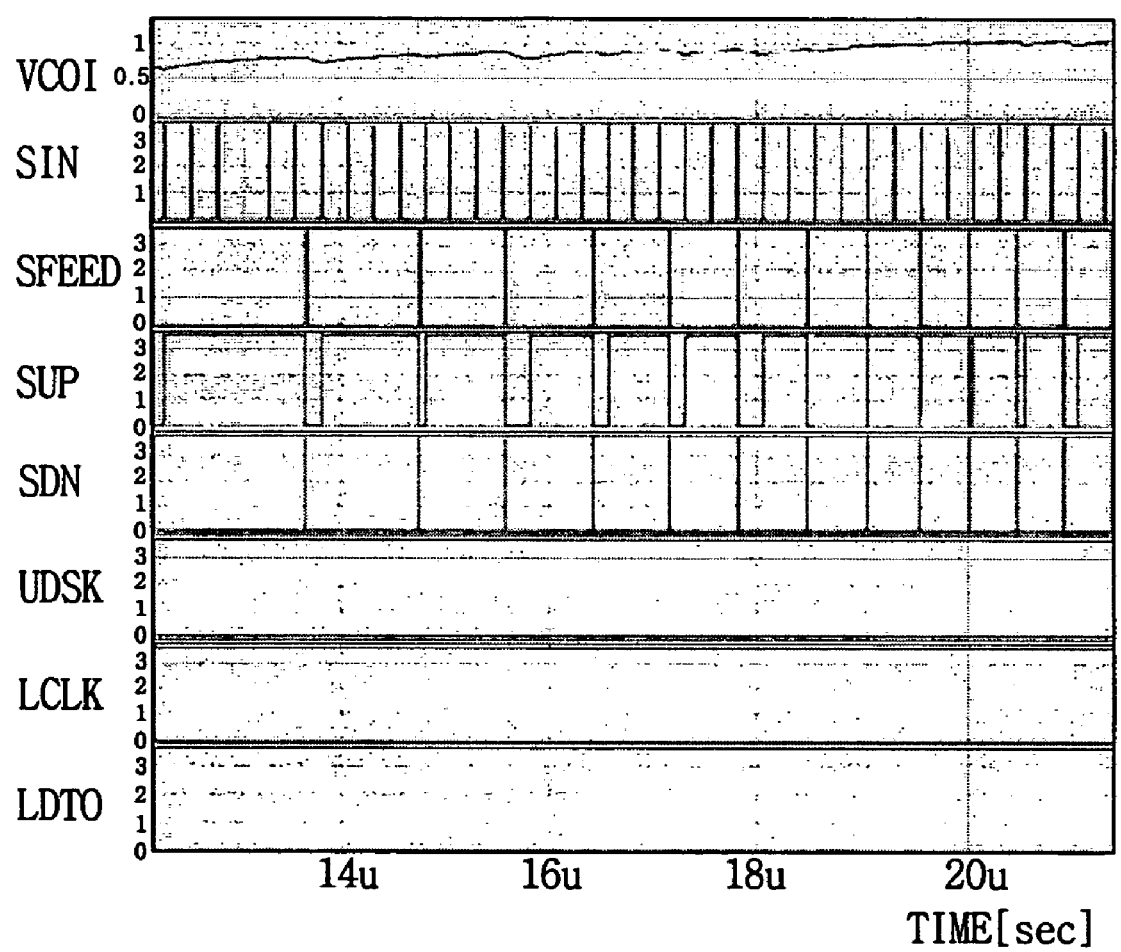
FIG. 14 is a diagram showing the simulation result for the circuits shown in FIG. 6 and FIG. 7 when the PLL circuit is in the first operating region.

FIG. 14 is a diagram showing the simulation result for the circuits shown in FIG. 6 and FIG. 7 when the PLL circuit is in the first operating region. As shown in FIG. 14, the up signal SUP of the PLL circuit is a pulse signal with wide pulse width and the down signal SDN of the PLL circuit is a pulse signal with nearly zero pulse width. Further, the input signal VCOI of the VCO 400 in FIG. 6 increases continuously. At this time, the lock detection clock signal LCLK and the lock detection signal LDTO maintain in the logic "0" state. That is, at this time, the lock detection signal LDTO is not generated.

Figure 15:
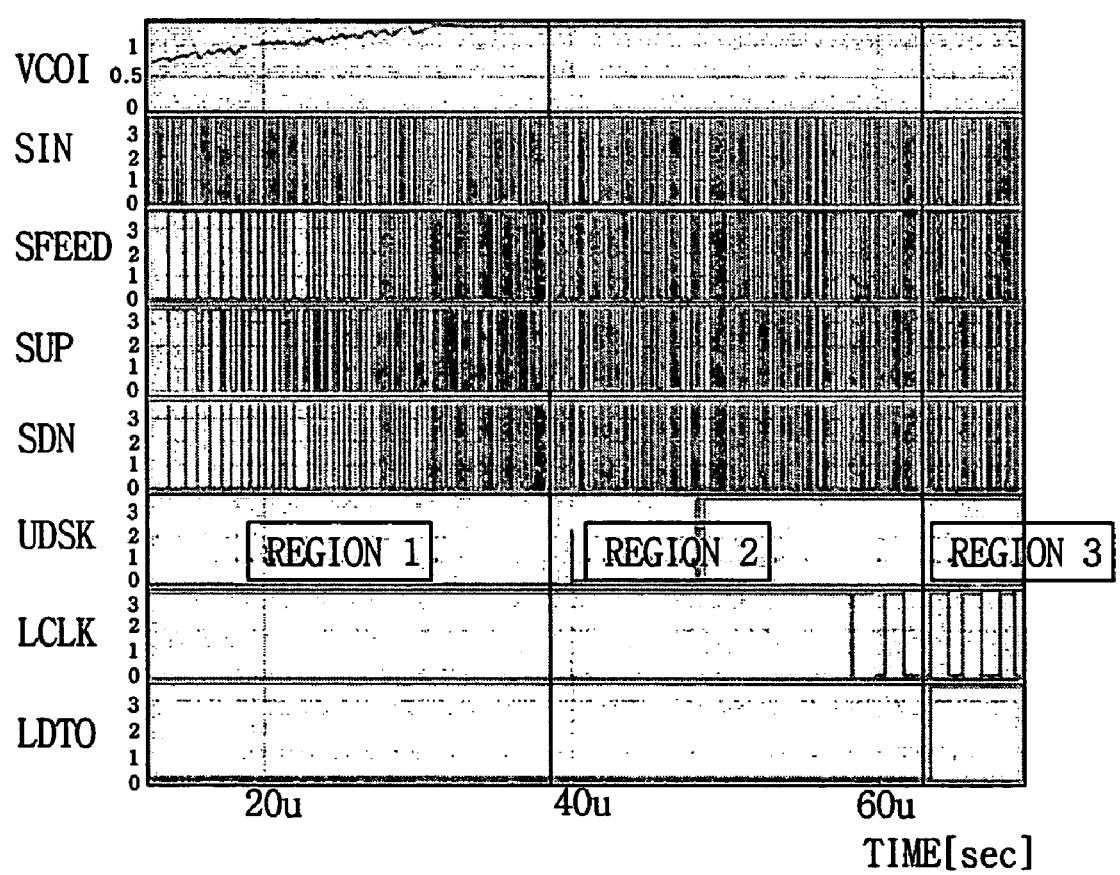
FIG. 15 is a diagram showing the simulation result for the circuits shown in FIG. 6 and FIG. 7 when the operating region is changed from the first operating region through the second operating region to the third operating region.

FIG. 15 is a diagram showing the simulation result for the circuits shown in FIG. 6 and FIG. 7 when the operating region is changed from the first operating region through the second operating region to the third operating region. As shown in FIG. 15, the up/down skew signal UDSK representative of starting of a lock detection is generated in the second operating region REGION2. The lock detection clock signal LCLK begins to oscillate after the up/down skew signal UDSK comes to the logic "1" state. The lock detection signal LDTO is generated at the third rising edge of the lock detection clock signal LCLK. The reason why the lock detection signal LDTO is generated after the rising edge of the lock detection clock signal LCLK appears three times, is that, after the up signal SUP and the down signal SDN appear about three times by turns, i.e., alternately, the PLL circuit can be thought to be sufficiently locked. A circuit designer may change the time point where the lock detection signal LDTO is generated. The time point where the lock detection signal LDTO is generated may be changed by changing the number of D-type flip-flops forming the lock-detection-signal generator 660. Three D-type flip-flops connected in series may be used as shown in FIG. 7 or in FIG. 13 in order to generate the lock detection signal LDTO after the rising edge of the lock detection clock signal LCLK appears three times.

Figure 16:
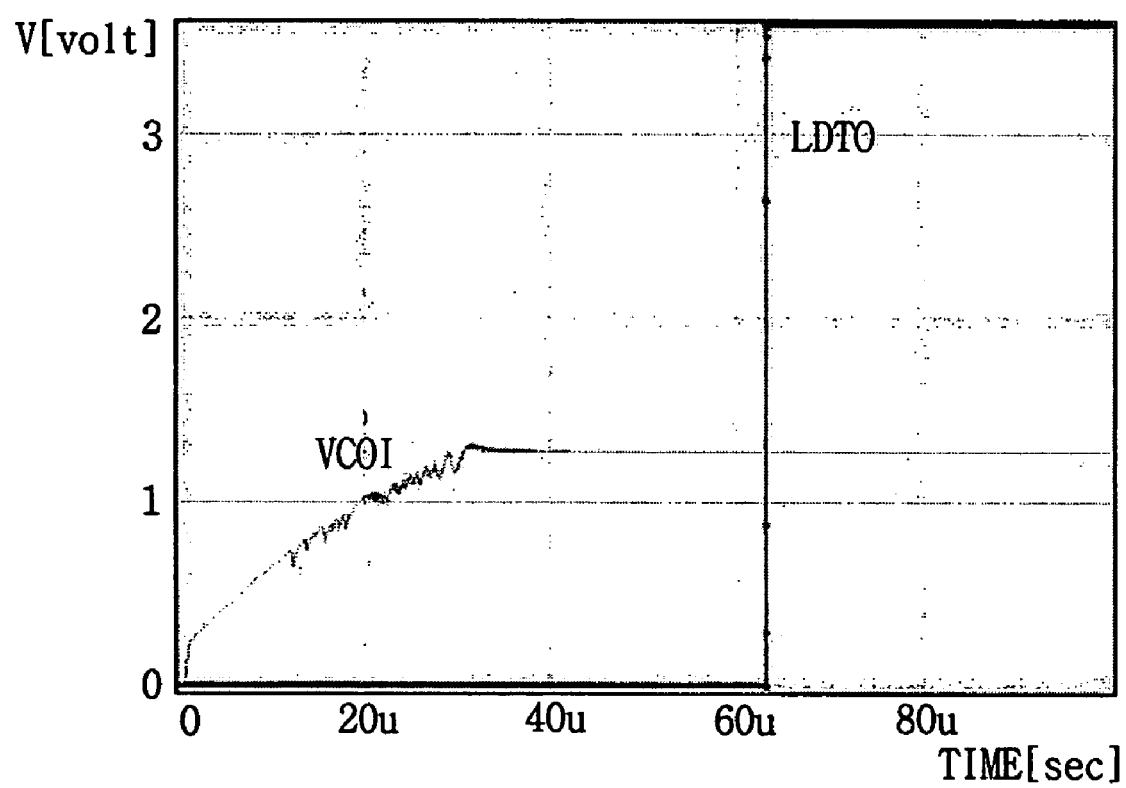
FIG. 16 is a diagram showing the simulation result for the PLL circuit of FIG. 6 in which the VCO input signal and the lock detection signal are shown together.

FIG. 16 is a diagram showing the simulation result of the VCO input signal and the lock detection signal for the PLL circuit of FIG. 6. As shown in FIG. 16, the lock detection signal LDTO is generated after the input signal VCOI of the VCO 400 is sufficiently stable, i.e., the phase lock of the PLL circuit is entirely accomplished.

The simulation results shown in FIG. 14 to FIG. 16 are results when the particular exemplary delay time generated by the delay circuit of the lock-detection-start-signal generator 620 is 8 nsec.

Hereinafter, the control of the lock detection time and the accuracy of the lock detection circuit will be described.

The lock detection time for the lock detection circuit is indicative of the time taken from deciding whether the locking of phase for the PLL circuit is completed to providing output of a "high" level signal. The accuracy of the lock detection circuit is indicative of the degree in which the output frequency of the PLL circuit approximates to the target value when the lock detection circuit outputs the "high" level signal. In the early time of the third operating region REGION3, the accuracy of the lock detection circuit is improved according to increase of the lock detection time. But, when a certain time passes, the accuracy of the lock detection circuit depends on the performance of the PLL circuit itself regardless of the lock detection time. The circuit designer can design the optimized lock detection circuit by adjusting the delay time TD generated by the delay circuit 622 of the lock-detection-start-signal generator 620 and the number of D-type flip-flops of the lock-detection-signal generator 660. When the delay time TD generated by the delay circuit 622 is increased, the time point where the lock detection circuit outputs the lock detection signal is delayed because the time point where the lock detection circuit recognizes the second operating region REGION2 is delayed. But, as the lock detection signal of the state of the "high" level is generated at the time point where the frequency of the PLL circuit sufficiently approximates to the target value, more accurate lock detection is realized. The delay time TD may be decreased to reduce the area that the lock detection circuit occupies when the circuit is implemented by the semiconductor integrated circuit. Reducing the delay time TD may cause the increase of the lock detection time.

The operating region of the PLL circuit can be discriminated using the states of the lock detection start signal RSC which is the output signal of the lock-detection-start-signal generator 620 and the lock detection signal LDTO which is the output signal of the lock-detection-signal generator 660. The operating region of the PLL circuit according to the states of the lock detection start signal RSC and the lock detection signal LDTO is represented in Table 3.

TABLE 3

| LDTO | RSC = UDSKB | Operating region |
|------|-------------|------------------|
| 0 | 1 | REGION1 |
| 0 | 0 | REGION2 |
| 1 | 0 | REGION3 |

Referring to Table 3, in the third operating region REGION3, the lock detection start signal RSC is in the logic "0" state and the lock detection signal LDTO is in the logic "1" state.

While the exemplary embodiments of the present invention and its advantages have been described in detail, it should be understood that various changes, substitutions and alterations can be made herein without departing from the scope of the invention as defined by appended claims.

What is claimed is:

1. A lock detection circuit in a phase-locked loop circuit including a phase-frequency detector and a voltage-controlled oscillator, comprising:
a lock-detection-start-signal generator configured to receive an up signal and a down signal generated by the phase-frequency detector, to generate a delay time, and to further generate a lock detection start signal when a pulse width of the up signal or the down signal is less than the delay time;
a lock-detection-clock generator configured to receive the up signal and the down signal to generate a lock detection clock signal, a duration of which is determined by rising edges of the up signal and the down signal; and
a lock-detection-signal generator configured to receive the lock detection start signal from the lock-detection-start-signal generator and the lock detection clock signal from the lock-detection-clock generator, and count the lock detection clock, to generate a lock detection signal indicative of a lock state in the phase-locked loop circuit.

2. The lock detection circuit of claim 1, wherein the lock-detection-start-signal generator comprises:
a NOR circuit configured to receive the up signal and the down signal, to execute a logical "NOR" operation, and thereby to generate a clock signal;
a delay circuit configured to receive the clock signal to delay the clock signal; and
a flip-flop including an input terminal for receiving the delayed clock signal, a clock terminal for receiving the clock signal, and an inverted output terminal for outputting the lock detection start signal.

3. The lock detection circuit of claim 2, wherein the lock detection circuit adjusts the delay time generated by the delay circuit to control a lock detection time and the accuracy of the lock detection circuit.

4. The lock detection circuit of claim 2, wherein the lock detection circuit generates the lock detection signal when an output frequency of the phase-locked loop circuit approximates to a target value by decreasing the delay time generated by the delay circuit.

5. The lock detection circuit of claim 1, wherein the lock-detection-clock generator comprises:
a first latch circuit configured to receive the up signal and the down signal and latch the signals to output a first output signal and a second output signal; and
a second latch circuit configured to receive the first output signal and the second output signal and latch the signals to generate the lock detection clock signal.

6. The lock detection circuit of claim 5, wherein each of the first and the second latch circuits includes two NAND circuits of which input terminals and output terminals are cross-coupled to each other.

7. The lock detection circuit of claim 1, wherein the lock-detection-signal generator includes at least one flip-flop connected in cascade that is controlled by the lock detection clock signal.

8. The lock detection circuit of claim 7, wherein each of the flip-flops is cleared by the lock detection start signal.

9. The lock detection circuit of claim 7, wherein the lock-detection-signal generator includes three flip-flops connected in series.

10. The lock detection circuit of claim 7, wherein an input terminal of the first flip-flop receives a signal of logic "1", and each of input terminals of the flip-flops following after the first stage flip-flop receives an output signal of the preceding stage flip-flop.

11. The lock detection circuit of claim 10, wherein the signal of logic "1" is a supply voltage.

12. The lock detection circuit of claim 10, wherein the lock-detection-start-signal generator is cleared by a reset signal, and the signal of logic "1" is an inverted signal of the reset signal.

13. A phase-locked loop circuit, comprising:
a phase-frequency detector configured to generate an up signal and a down signal that indicate the phase difference between a reference signal and a feedback signal;
a charge pump configured to receive the up signal and the down signal from the phase-frequency detector to output a dc voltage signal in response to a state of the up signal or the down signal;
a loop filter configured to integrate the output signal of the charge pump to generate an integrated signal;
a voltage-controlled oscillator configured to receive the integrated signal from the loop filter to generate an oscillating signal whose frequency is controlled in accordance with a dc level of the integrated signal;
a lock-detection-start-signal generator configured to receive the up signal and the down signal generated by the phase-frequency detector to generate a delay time and to further generate a lock detection start signal when a pulse width of the up signal or the down signal is less than the delay time;
a lock-detection-clock generator configured to receive the up signal and the down signal to generate a lock detection clock signal, a duration of which is determined by rising edges of the up signal and the down signal; and a lock-detection-signal generator configured to receive the lock detection start signal from the lock-detection-start-signal generator and the lock detection clock signal from the lock-detection-clock generator and count the lock detection clock to generate a lock detection signal.

14. The phase-locked loop circuit of claim 13, further comprising a frequency divider configured to generate a low frequency feedback signal on the basis of a high frequency output signal of the voltage-controlled oscillator.

15. The phase-locked loop circuit of claim 13, wherein the lock-detection-start-signal generator comprises:
a NOR circuit configured to receive the up signal and the down signal and execute a logical "NOR" operation to generate a clock signal;
a delay circuit configured to receive the clock signal to delay the clock signal; and
a flip-flop including an input terminal for receiving the delayed clock signal, a clock terminal for receiving the clock signal, and an inverted output terminal for outputting the lock detection start signal.

16. The phase-locked loop circuit of claim 15, wherein the lock detection circuit adjusts the delay time generated by the delay circuit to control a lock detection time and the accuracy of the lock detection circuit.

17. The phase-locked loop circuit of claim 15, wherein the lock detection circuit generates the lock detection signal when an output frequency of the phase-locked loop circuit approximates to a target value by decreasing the delay time generated by the delay circuit.

18. The phase-locked loop circuit of claim 13, wherein the lock-detection-clock generator comprises:
a first latch circuit configured to receive the up signal and the down signal and latch the signals, to output a first output signal and a second output signal; and
a second latch circuit configured to receive the first output signal and the second output signal and latch the signals to generate the lock detection clock signal.

19. The phase-locked loop circuit of claim 18, wherein each of the first and the second latch circuits includes two NAND circuits of which input terminals and output terminals are cross-coupled to each other.

20. The phase-locked loop circuit of claim 13, wherein the lock-detection-signal generator includes at least one flip-flop connected in cascade that is controlled by the lock detection clock signal.

21. The phase-locked loop circuit of claim 20, wherein each of the flip-flops is cleared by the lock detection start signal.

22. The phase-locked loop circuit of claim 20, wherein the lock-detection-signal generator includes three flip-flops connected in series.

23. The phase-locked loop circuit of claim 20, wherein an input terminal of the first flip-flop receives a signal of logic "1", and each of the input terminals of the flip-flops succeeding after the first stage flip-flop receives an output signal of the preceding stage flip-flop.

24. The phase-locked loop circuit of claim 23, wherein the signal of logic "1" is a supply voltage.

25. The phase-locked loop circuit of claim 23, wherein the lock-detection-start-signal generator is cleared by a reset signal, and the signal of logic "1" is an inverted signal of the reset signal.

26. A lock detection method of a phase-locked loop circuit, comprising:
receiving an up signal and a down signal generated on the basis of a phase difference between a reference signal and a feedback signal, thereby generating a delay time and further generating a lock detection start signal when a pulse width of the up signal and down signal is less than the delay time;
generating a lock detection clock signal, a duration of which is determined by rising edges of the up signal and down signal; and
receiving the lock detection start signal and the lock detection clock signal to count the number of the lock detection clock signals, thereby generating a lock detection signal.

27. The lock detection method of a phase-locked loop circuit of claim 26, wherein the lock detection start signal is generated by:
executing a logical "NOR" operation for the up signal and the down signal, to generate a clock signal;
delaying the clock signal; and
generating the lock detection start signal in response to the delayed clock signal and the clock signal.

28. The lock detection method of a phase-locked loop circuit of claim 27, wherein delaying the clock signal includes adjusting the delay time so that a lock detection time and an accuracy of a lock detection circuit can be controlled.

29. The lock detection method of a phase-locked loop circuit of claim 26, wherein generating the lock detection signal is possible when an output frequency of the phase-locked loop circuit approximates to a target value by decreasing a delay time generated by delaying the clock signal.

30. The lock detection method of a phase-locked loop circuit of claim 26, wherein generating the lock detection clock signal comprises:
receiving and latching the up signal and the down signal to output a first output signal and a second output signal; and
receiving and latching the first output signal and the second output signal to output the lock detection clock signal.

31. The lock detection method of a phase-locked loop circuit of claim 26, wherein generating the lock detection signal comprises:
clearing a lock-detection-signal generator by the lock detection start signal;
counting the number of front edges of the lock detection clock signal; and
outputting the lock detection signal.

32. The lock detection method of a phase-locked loop circuit of claim 31, wherein clearing a lock-detection-signal generator is done when the lock detection start signal is in active state.

33. A phase-locked loop circuit, comprising:
a phase-frequency detector configured to generate an up signal and a down signal that indicate the phase difference between a reference signal and a feedback signal;
a charge pump configured to receive the up signal and the down signal from the phase-frequency detector to output a dc voltage signal in response to a state of the up signal or the down signal;
a loop filter configured to integrate the output signal of the charge pump to generate an integrated signal;
a voltage-controlled oscillator configured to receive the integrated signal from the loop filter to generate an oscillating signal whose frequency is controlled in accordance with a dc level of the integrated signal; and a lock detection circuit configured to receive the up signal and the down signal to generate a lock detection signal indicating the lock state of phase, wherein the lock detection signal is generated in a third operating region when an operating region of the phase-locked loop circuit is divided into three parts, a first operating region where the input voltage of the voltage-controlled oscillator increases continuously, a second operating region where an amplitude of the input voltage is decreased while the input voltage of the voltage-controlled oscillator is repeatedly increased and decreased in rotation and the up signal and the down signal are generated alternately, and the third operating region where the input voltage of the voltage-controlled oscillator is converged to a certain value and maintains the value, wherein the lock detection circuit comprises at least one latch circuit that receives the up signal and down signal and latches the up signal and the down signal to detect whether the up signal and the down signal are generated alternately.

34. A lock detection method of a phase-locked loop circuit, comprising:
generating an up signal and a down signal indicating the phase difference between a reference signal and a feedback signal
receiving the up signal and the down signal to output a dc voltage signal corresponding to the state of the up signal and the down signal;
integrating the dc voltage signal to generate an integrated signal;
generating an oscillating signal whose frequency changes in accordance with the dc level of the integrated signal; and
receiving the up and down signals to generate a lock detection signal indicating the lock state of phase, wherein the lock detection signal is generated in a third operating region when an operating region of the phase-locked loop circuit is divided into three parts, a first operating region where the input voltage of the voltage-controlled oscillator increases continuously, a second operating region where an amplitude of the input voltage is decreased while the input voltage of the voltage-controlled oscillator is repeatedly increased and decreased in rotation and and the up signal and the down signal are generated alternately, and wherein the up signal and the down signal are latched to detect whether the up signal and the down signal are generated alternately, and a third operating region where the input voltage of the voltage-controlled oscillator is converged to a value and maintains the value.

35. A lock detection circuit in a phase-locked loop circuit including a phase-frequency detector and a voltage-controlled oscillator, comprising:
a lock-detection-start-signal generator configured to receive an up signal and a down signal generated by the phase-frequency detector, to generate a lock detection start signal when a pulse width of the up signal or the down signal reaches a predetermined value;
a lock-detection-clock generator configured to receive the up signal and the down signal to generate a lock detection clock signal on the basis of the up signal and the down signal, wherein the lock-detection-clock generator comprises:
a first latch circuit configured to receive the up signal and the down signal and latch the signals to output a first output signal and a second output signal; and
a second latch circuit configured to receive the first output signal and the second output signal and latch the signals to generate the lock detection clock signal; and
a lock-detection-signal generator configured to receive the lock detection start signal from the lock-detection-start-signal generator and the lock detection clock signal from the lock-detection-clock generator, and count the lock detection clock, to generate a lock detection signal indicative of a lock state in the phase-locked loop circuit.

36. The lock detection circuit of claim 35, wherein each of the first and the second latch circuits includes two NAND circuits of which input terminals and output terminals are cross-coupled to each other.

37. A lock detection circuit in a phase-locked loop circuit including a phase-frequency detector and a voltage-controlled oscillator, comprising:
a lock-detection-start-signal generator configured to receive an up signal and a down signal generated by the phase-frequency detector, to generate a lock detection start signal when a pulse width of the up signal or the down signal reaches a predetermined value;
a lock-detection-clock generator configured to receive the up signal and the down signal to generate a lock detection clock signal on the basis of the up signal and the down signal; and
a lock-detection-signal generator configured to receive the lock detection start signal from the lock-detection-start-signal generator and the lock detection clock signal from the lock-detection-clock generator, and count the lock detection clock, to generate a lock detection signal indicative of a lock state in the phase-locked loop circuit, wherein the lock-detection-signal generator includes at least one flip-flop connected in cascade that is controlled by the lock detection clock signal, and wherein each of the flip-flops is cleared by the lock detection start signal.

38. A lock detection circuit in a phase-locked loop circuit including a phase-frequency detector and a voltage-controlled oscillator, comprising:
a lock-detection-start-signal generator configured to receive an up signal and a down signal generated by the phase-frequency detector, to generate a lock detection start signal when a pulse width of the up signal or the down signal reaches a predetermined value;
a lock-detection-clock generator configured to receive the up signal and the down signal to generate a lock detection clock signal on the basis of the up signal and the down signal; and
a lock-detection-signal generator configured to receive the lock detection start signal from the lock-detection-start-signal generator and the lock detection clock signal from the lock-detection-clock generator, and count the lock detection clock, to generate a lock detection signal indicative of a lock state in the phase-locked loop circuit, wherein the lock-detection-signal generator includes at least one flip-flop connected in cascade that is controlled by the lock detection clock signal, wherein an input terminal of the first flip-flop receives a signal of logic "1", and each of input terminals of the flip-flops following after the first stage flip-flop receives an output signal of the preceding stage flip-flop, and wherein the lock-detection-start-signal generator is cleared by a reset signal, and the signal of logic "1" is an inverted signal of the reset signal.

39. A phase-locked loop circuit, comprising:

a phase-frequency detector configured to generate an up signal and a down signal that indicate the phase difference between a reference signal and a feedback signal;

a charge pump configured to receive the up signal and the down signal from the phase-frequency detector to output a dc voltage signal in response to a state of the up signal or the down signal;

a loop filter configured to integrate the output signal of the charge pump to generate an integrated signal;

a voltage-controlled oscillator configured to receive the integrated signal from the loop filter to generate an oscillating signal whose frequency is controlled in accordance with a dc level of the integrated signal;

a lock-detection-start-signal generator configured to receive the up signal and the down signal generated by the phase-frequency detector to generate a lock detection start signal when the pulse width of the up signal and the down signal reaches a predetermined value;

a lock-detection-clock generator configured to receive the up signal and the down signal to generate a lock detection clock signal on the basis of the up signal and the down signal, wherein the lock-detection-clock generator comprises:

a first latch circuit configured to receive the up signal and the down signal and latch the signals, to output a first output signal and a second output signal; and a second latch circuit configured to receive the first output signal and the second output signal and latch the signals to generate the lock detection clock signal; and a lock-detection-signal generator configured to receive the lock detection start signal from the lock-detection-start-signal generator and the lock detection clock signal from the lock-detection-clock generator and count the lock detection clock to generate the lock detection signal.

40. The phase-locked loop circuit of claim 39, wherein each of the first and the second latch circuits includes two NAND circuits of which input terminals and output terminals are cross-coupled to each other.

41. A phase-locked loop circuit, comprising:

a phase-frequency detector configured to generate an up signal and a down signal that indicate the phase difference between a reference signal and a feedback signal;

a charge pump configured to receive the up signal and the down signal from the phase-frequency detector to output a dc voltage signal in response to a state of the up signal or the down signal;

a loop filter configured to integrate the output signal of the charge pump to generate an integrated signal;

a voltage-controlled oscillator configured to receive the integrated signal from the loop filter to generate an oscillating signal whose frequency is controlled in accordance with a dc level of the integrated signal;

a lock-detection-start-signal generator configured to receive the up signal and the down signal generated by the phase-frequency detector to generate a lock detection start signal when the pulse width of the up signal and the down signal reaches a predetermined value;

a lock-detection-clock generator configured to receive the up signal and the down signal to generate a lock detection clock signal on the basis of the up signal and the down signal; and a lock-detection-signal generator configured to receive the lock detection start signal from the lock-detection-start-signal generator and the lock detection clock signal from the lock-detection-clock generator and count the lock detection clock to generate the lock detection signal, wherein the lock-detection-signal generator includes at least one flip-flop connected in cascade that is controlled by the lock detection clock signal, wherein each of the flip-flops is cleared by the lock detection start signal.

42. A phase-locked loop circuit, comprising:

a phase-frequency detector configured to generate an up signal and a down signal that indicate the phase difference between a reference signal and a feedback signal;

a charge pump configured to receive the up signal and the down signal from the phase-frequency detector to output a dc voltage signal in response to a state of the up signal or the down signal;

a loop filter configured to integrate the output signal of the charge pump to generate an integrated signal;

a voltage-controlled oscillator configured to receive the integrated signal from the loop filter to generate an oscillating signal whose frequency is controlled in accordance with a dc level of the integrated signal;

a lock-detection-start-signal generator configured to receive the up signal and the down signal generated by the phase-frequency detector to generate a lock detection start signal when the pulse width of the up signal and the down signal reaches a predetermined value;

a lock-detection-clock generator configured to receive the up signal and the down signal to generate a lock detection clock signal on the basis of the up signal and the down signal; and a lock-detection-signal generator configured to receive the lock detection start signal from the lock-detection-start-signal generator and the lock detection clock signal from the lock-detection-clock generator and count the lock detection clock to generate the lock detection signal, wherein the lock-detection-signal generator includes at least one flip-flop connected in cascade that is controlled by the lock detection clock signal, wherein an input terminal of the first flip-flop receives a signal of logic "1", and each of the input terminals of the flip-flops succeeding after the first stage flip-flop receives an output signal of the preceding stage flip-flop, and wherein the lock-detection-start-signal generator is cleared by a reset signal, and the signal of logic "1" is an inverted signal of the reset signal.

43. A lock detection method of a phase-locked loop circuit, comprising:

receiving an up signal and a down signal generated on the basis of a phase difference between a reference signal and a feedback signal, thereby generating a lock detection start signal when the pulse width of the up signal and down signal reaches a predetermined value;

generating a lock detection clock signal on the basis of the up signal and down signal, wherein generating the lock detection clock signal comprises:

receiving and latching the up signal and the down signal to output a first output signal and a second output signal; and receiving and latching the first output signal and the second output signal to output the lock detection clock signal; and receiving the lock detection start signal and the lock detection clock signal to count the number of the lock detection clock signals, thereby generating the lock detection signal.

44. The lock detection method of a phase-locked loop circuit of claim 43, wherein generating the lock detection signal comprises:

clearing a lock-detection-signal generator by the lock detection start signal;

counting the number of front edges of the lock detection clock signal; and outputting the lock detection signal.

45. The lock detection method of a phase-locked loop circuit of claim 44, wherein clearing a lock-detection-signal generator is done when the lock detection start signal is in active state.

\* \* \* \* \*